United States Patent
Bertin et al.

[11] Patent Number: 5,909,400
[45] Date of Patent: Jun. 1, 1999

[54] THREE DEVICE BICMOS GAIN CELL

[75] Inventors: Claude Louis Bertin, S. Burlington; John Atkinson Fifield, Underhill; Russell J. Houghton, Essex Junction; Christopher P. Miller, Underhill; William R. Tonti, Essex Junction, all of Vt.

[73] Assignee: International Business Machines Corporation, Armonk, N.Y.

[21] Appl. No.: 08/917,630

[22] Filed: Aug. 22, 1997

[51] Int. Cl.[6] .................................................. G11C 11/34
[52] U.S. Cl. ......................... 365/187; 365/149; 365/177; 365/230.05
[58] Field of Search .................................. 365/187, 149, 365/177, 230.05

[56] References Cited

U.S. PATENT DOCUMENTS

| | | | |
|---|---|---|---|
| 4,090,254 | 5/1978 | Ho et al. | 365/150 |
| 4,276,616 | 6/1981 | Hennig | 365/177 |
| 4,677,589 | 6/1987 | Haskell et al. | 365/149 |
| 4,933,899 | 6/1990 | Gibbs | 365/177 |
| 5,027,323 | 6/1991 | Miyamoto et al. | 365/189.11 |
| 5,038,191 | 8/1991 | Hasegawa et al. | 257/205 |
| 5,060,194 | 10/1991 | Sakui et al. | 365/177 |
| 5,757,693 | 5/1998 | Houghton et al. | 365/149 |
| 5,761,114 | 6/1998 | Bertin et al. | 365/168 |

*Primary Examiner*—David Nelms
*Assistant Examiner*—VanThu Nguyen
*Attorney, Agent, or Firm*—Scully, Scott, Murphy & Presser; Robert A. Walsh

[57] ABSTRACT

A nondestructive read, three device BICMOS gain cell for a DRAM memory having two FETs and one bipolar device. The gain cell has an improved access time (less latency), can operate for longer periods of time before a refresh operation is required, requires a smaller storage capacitance than a traditional DRAM cell, and can be produced commercially at lower costs than are presently available. In a preferred embodiment, the gain cell comprises an n channel metal oxide semiconductor field effect write transistor having its gate connected to a write word line WLw. Its drain is connected to a storage node Vs having a storage capacitance Cs associated therewith, and its source is connected to a write bit line BLw. An n channel metal oxide semiconductor field effect read transistor has its gate connected to the storage node Vs and its source connected to a read word line WLr. A PNP transistor has its base connected to the drain of the read transistor and its emitter connected to a read bit line BLr. A second embodiment is constructed with p channel FETs and an NPN transistor.

16 Claims, 7 Drawing Sheets

THREE DEVICE BICMOS GAIN CELL

BACKGROUND OF THE INVENTION

1. Technical Field

The present invention relates generally to a three device BICMOS gain cell for a DRAM memory, and more particularly pertains to a nondestructive read (NDRO) three device gain cell having two FETs and one bipolar device

2. Discussion of the Art

As is well known in the art, DRAMs (dynamic random access memories) are memory devices in which data are stored capacitively, and which must be recharged (refreshed) periodically (every 64 msec or so), or the data will be lost. SRAMs (static random access memories) are memory devices in which static memory cells are generally cross-coupled bistable circuits wherein information is stored by one of the two stable states, such as in a conventional bistable flip-flop, and does not need to be refreshed. Present state of the art DRAMs are relatively dense (16 Mb (megabit) DRAMs in production) as compared with 1 Mb SRAMs, but they have much slower access times than SRAM memories. DRAMS also have much longer cycle times since data is destroyed during a read operation and cell data must be regenerated.

There is a need for DRAMs having improved access times (less latency) as well as improved cycle times. There is also a need for DRAM memories in which the gain cells therein can operate for longer periods of time before a refresh operation is required and which read data in a nondestructive manner, and which require smaller storage capacitance than traditional DRAM cells. There is also a need for larger, higher performance DRAM memories which can be produced commercially at lower costs than are presently available.

SUMMARY OF THE INVENTION

Accordingly, it is a primary object of the present invention to provide a three device BICMOS gain cell for a DRAM memory.

A further object of the subject invention is the provision of a nondestructive read (NDRO) three device gain cell having two FETs and one bipolar device. This gain cell has an improved access time (less latency), can operate for longer periods of time before a refresh operation is required, requires a smaller storage capacitance than a traditional DRAM cell, and can be produced commercially at lower costs than are presently available for other cost/performance solutions such as multi-device DRAM cells and SRAM cells.

In accordance with the teachings herein, the present invention provides a gain cell for a dynamic random access memory. The gain cell comprises a metal oxide semiconductor field effect write transistor having its gate connected to a write word line WLw. Its drain is connected to a storage node Vs having a storage capacitance Cs associated therewith, and its source is connected to a write bit line BLw. A metal oxide semiconductor field effect read transistor has its gate connected to the storage node Vs and its source connected to a read word line WLr. A bipolar transistor has its base connected to the drain of the read transistor and its emitter connected to a read bit line BLr.

In a preferred embodiment, the write and read transistors comprise n channel metal oxide semiconductor field effect transistors, and the bipolar transistor comprises a PNP transistor. This construction allows the substrate to be formed of a P− material, and draws less current during operation.

In greater detail, the storage capacitance is connected between the storage node Vs and the substrate of the gain cell, and the collector of the PNP transistor is also connected to the substrate. During a read operation, the previously precharged capacitive read bit line BLr is rapidly discharged through the series connected read transistor and PNP transistor, and rapid discharge of the read bit line BLr is possible because of the high gain of this combination of components.

The base of the PNP transistor is formed by an N− well which merges into an N+ drain of the read transistor. The emitter of the PNP transistor is a standard P+ junction, the base is a standard N− well, and the collector is a P− substrate. Alternatively, the emitter of the PNP transistor is a standard P+ junction, or a modified P+ junction (e.g. polysilicon stud for emitter efficiency), the base is a modified N− region (e.g. for base width and gain improvement) used to separately tune the bipolar transistor gain, and the collector is the P− substrate.

In a second embodiment, the write and read transistors comprise p channel metal oxide semiconductor field effect transistors, and the bipolar transistor comprises an NPN transistor. The storage capacitance is connected between the storage node Vs and a substrate of the gain cell, and the collector of the NPN transistor is also connected to the substrate. During a read operation, the previously uncharged capacitive read bit line BLr is rapidly charged through the series connected read transistor and NPN transistor, and rapid charge of the read bit line BLr is possible because of the high gain of this combination.

BRIEF DESCRIPTION OF THE DRAWINGS

The foregoing objects and advantages of the present invention for a three device BICMOS gain cell may be more readily understood by one skilled in the art with reference being had to the following detailed description of several preferred embodiments thereof, taken in conjunction with the accompanying drawings wherein like elements are designated by identical reference numerals throughout the several views, and in which.

DETAILED DESCRIPTION OF THE DRAWINGS

Figure 1:
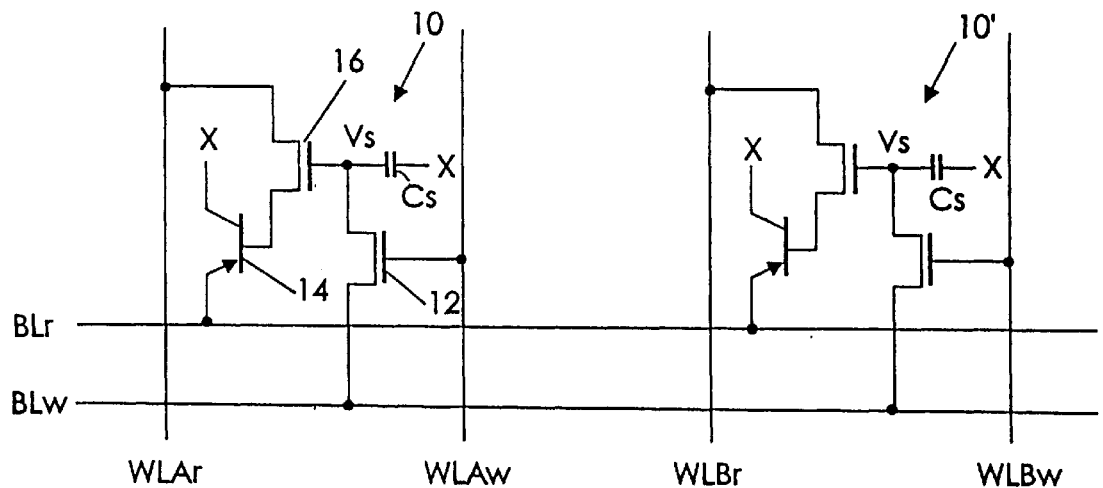
FIG. 1 illustrates an exemplary preferred embodiment of a three device PNP BICMOS gain cell for a DRAM memory having two FETs and one bipolar PNP transistor.

Referring to the drawings in detail, FIG. 1 illustrates an exemplary three device PNP BICMOS (bipolar complementary metal oxide semiconductor) gain cell 10 having separate read and write paths. A first NMOS (n channel metal oxide semiconductor) FET (field effect transistor) write device 12 is driven by a write word line, WLAw, to transfer data from a write bit line, BLw, to a storage node Vs having a storage capacitance Cs associated therewith which couples to a substrate at X. Data on the storage node Vs is sensed and driven to the read bit line, BLr, via a bipolar PNP device 14 in series with a second NMOS FET read device 16. A DRAM memory is composed of many similar gain cells, and FIG. 1 also illustrates a second gain cell 10' connected in a similar fashion to the first gain cell 10.

Figure 2:
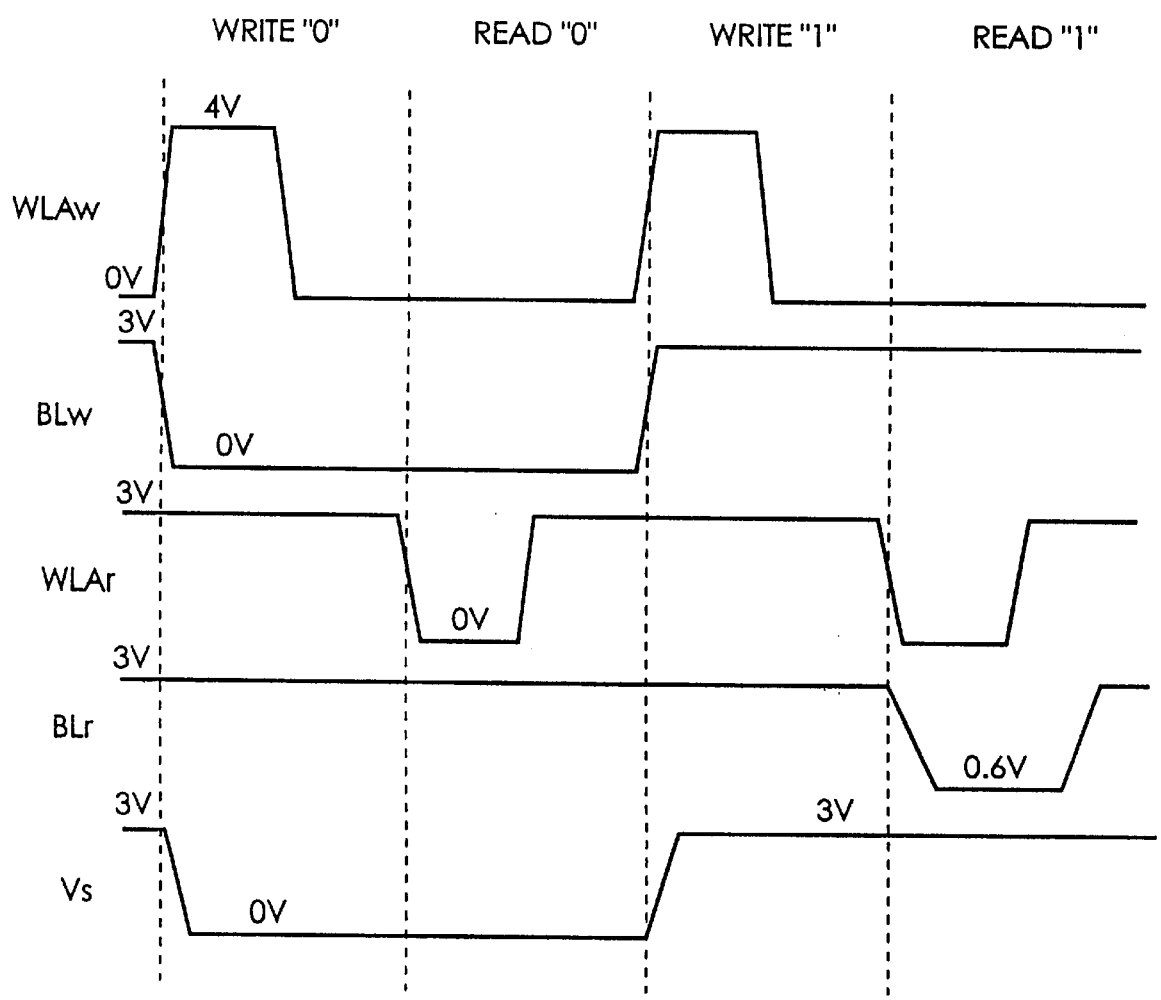
FIG. 2 illustrates exemplary operational waveforms for a typical read/write sequence for the gain cell of FIG. 1.

FIG. 2 illustrates exemplary operational waveforms for a typical read/write sequence for the gain cell 10 of FIG. 1. Writing a full 3 V "1" to the storage node Vs requires a boosted level at write word line, WLAw, (i.e. 4 V) as shown. In a read operation, the read word line WLAr is lowered to 0 V. If Vs=3 V (logic "1"), the previously precharged capacitive read bit line BLr is pulled to 0.6 V (Vbe) above ground by the series connected PNP/NMOS devices 14,16. Rapid discharge of the read bit line BLr is possible because of the high gain of this configuration (for example, gain=10 to 100). An advantage realized by this gain cell is that the high drive current path to ground is through the PNP device and not the word line. Also the read bit line BLr can be driven to a logic level without the need for a sense amplifier, as is frequently required in prior art DRAM memory cells.

Figure 3:
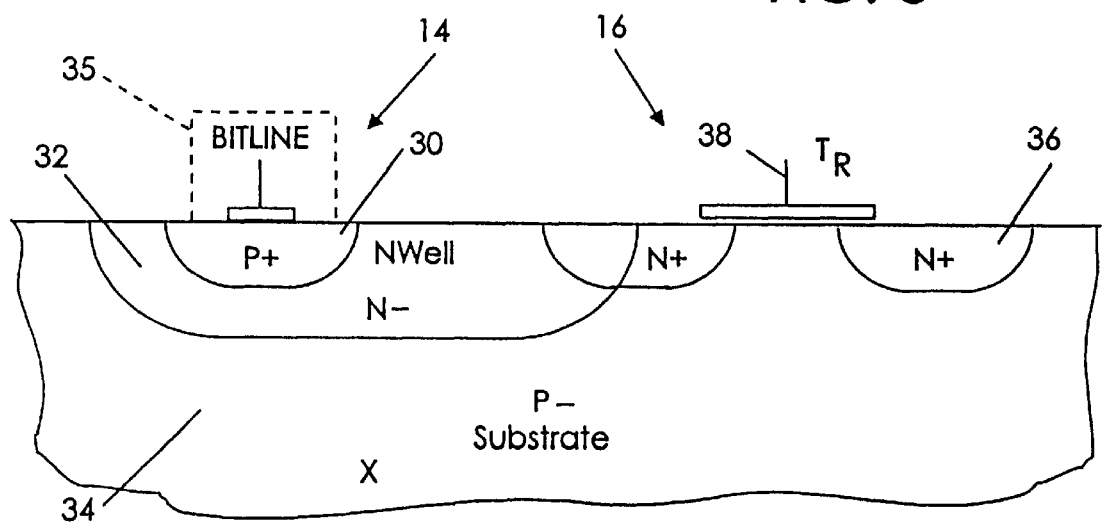
FIG. 3 illustrates a fabrication technique for the bipolar device and read transistor of FIG. 1.

FIG. 3 illustrates a fabrication technique for the bipolar device and read transistor of FIG. 1. As a first cost performance option, the emitter is a standard P+ junction 30, and the base is the standard N− well 32 for a given technology. The collector is the P− substrate 34. The N− base 32 of the PNP device merges into the N+ drain of the NMOS FET transistor which also has an N+ source diffusion area 36 and a gate 38.

As a second performance option, the emitter is a standard P+ junction, or a modified P+ junction taking advantage of a polysilicon stud contact 35, which is typically used only for CMOS transistor source drain connections. In this embodiment the stud contact is used as a bipolar emitter which improves the emitter efficiency greatly. The base is a modified N-well used to separately tune the bipolar gain. Thus, an extra N-well mask is used. The collector is the P-substrate.

Figure 4:
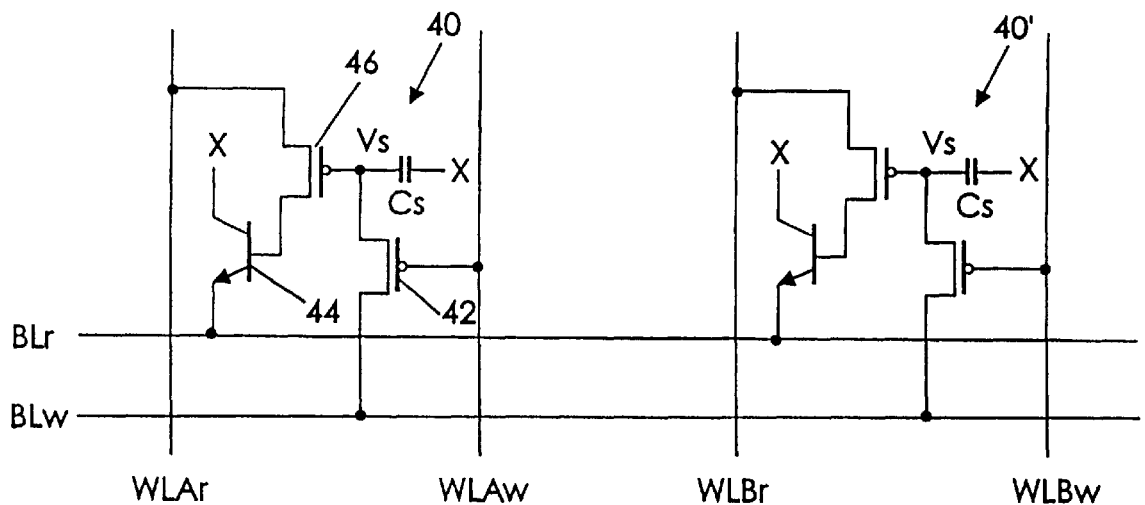
FIG. 4 illustrates a second embodiment of an exemplary three device NPN BICMOS gain cell for a DRAM memory having two FETs and one bipolar NPN transistor.

FIG. 4 illustrates an exemplary three device NPN BICMOS gain cell 40 having separate read and write paths. A first PMOS (p channel metal oxide semiconductor) FET write device 42 is driven by a write word line, WLAw, to transfer data from a write bit line, BLw, to a storage node Vs having a storage capacitance Cs associated therewith which couples to an N region at X. Data on the storage node Vs is sensed and driven to the read bit line, BLr, via a bipolar NPN device 44 in series with a second PMOS FET read device 46. A DRAM memory is composed of many similar gain cells, and FIG. 1 also illustrates a second gain cell 40' connected in a similar fashion to the first gain cell 40. In this embodiment, node X could be an NWELL region biased at 3.0 V.

Figure 5:
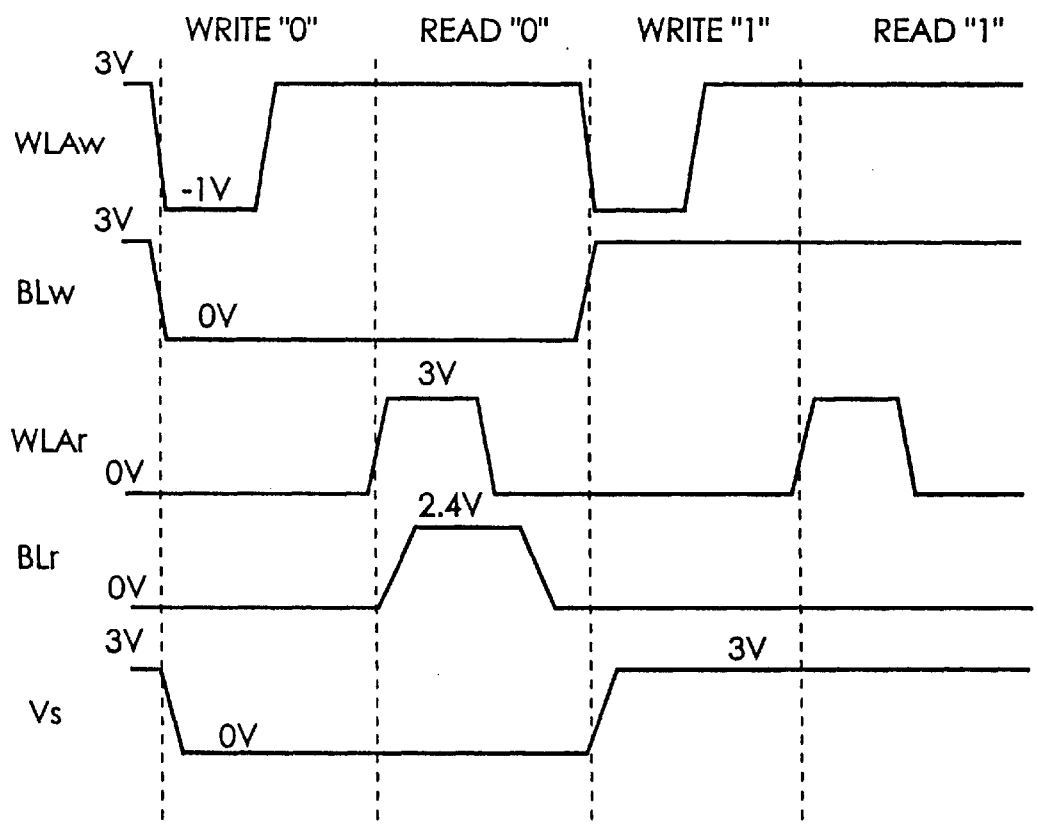
FIG. 5 illustrates exemplary operational waveforms for a typical read/write sequence for the gain cell of FIG. 4.

FIG. 5 illustrates exemplary operational waveforms for a typical read/write sequence for the gain cell 40. Writing a full 0 V "0" to the storage node Vs requires a boosted negative level at write word line, WLAw, (i.e.−1 V) as shown. In a read operation from cell 40, the read word line WLAr is raised to 3 V. If Vs=0 V (logic "0"), the previously uncharged capacitive read bit line BLr is raised to 2.4 V (Vbe) above ground by the series connected NPN/PMOS devices 44,46. Rapid charge of the read bit line BLr is possible because of the high gain of this configuration. An advantage realized by this gain cell is that the high drive current path to node X is through the NPN device and not the word line. Also the read bit line BLr can be driven to a logic level without the need for a sense amplifier, as is frequently required in prior art DRAM memory cells.

The following represents a preferred low cost process sequence for fabricating the BICMOS, DRAM memory element in bulk silicon. Optional processing is pointed out where an improved bipolar transistor may be fabricated at extra cost.

This fabrication sequence assumes NMOS read/write transistors and a PNP bipolar. A dual process exists for PMOS read/write transistors and an NPN bipolar.

Step 1: Isolation Region and Storage Capacitor Region Definition. (FIG. 6)

A) Starting material is standard P Type substrate 60, 1 Ω-cm±10%.

B) Isolation Regions 62 (labeled Isolation Oxide) and Cs Regions (labeled Storage Trench 64) are defined.

Figure 6:
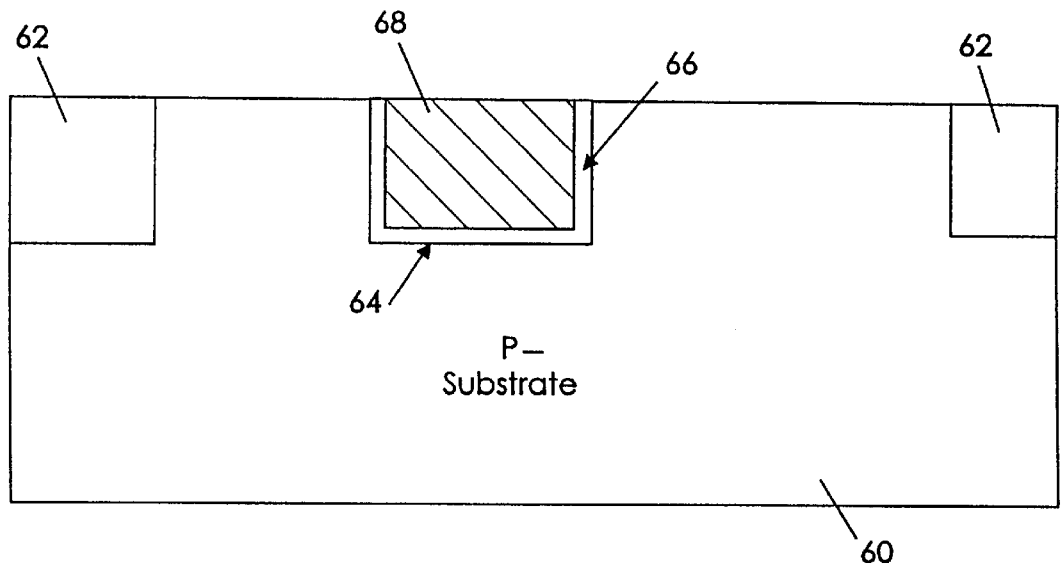
FIG. 6 illustrates the start of a fabrication process starting with a standard P Type bulk silicon substrate wherein isolation regions and storage capacitor regions are defined.

C) A mask is used to etch the storage silicon trenches 64 (which extend vertically in FIG. 6).

D) A thin storage dielectric 66 is grown on all trench surfaces, and then polished back to the planar silicon surface.

E) A second mask is used to deposit storage polysilicon 68 over those regions (crosshatched in FIG. 6) which will become Cs cell capacitors. It is important to realize the trench used for isolation is also used for the storage capacitance. This provides a large cost savings over a 1 device DRAM cell design, and allows logic and memory to share exactly the same process. The capacitor design is reviewed below in the Silicon On Insulator (SOI) section.

F) The polysilicon 68 is polished to the silicon surface, and isolation oxide is deposited on the entire wafer to fill the isolation regions. This oxide is then polished back to the silicon surface forming the completed transistor isolation.

Figure 7:
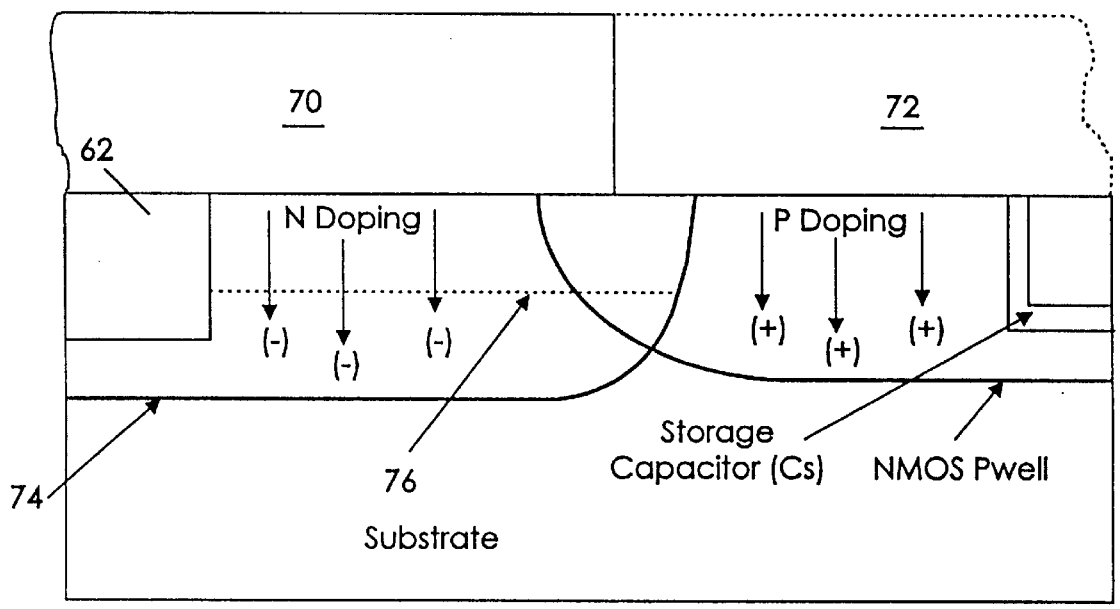
FIG. 7 illustrates a subsequent stage in the fabrication process wherein NMOS and PMOS implant well regions are defined, with the PNP bipolar N-well mask butted to the P-well mask.

Step 2: Identify Well Regions (FIG. 7)

NMOS and PMOS implant well regions are defined, with the PNP bipolar N-well mask 70 butted to the P-well mask 72. The N-well mask is either the standard well used for PMOS devices, (shown as the solid N-well boundary 74 in FIG. 7), or it may be an additional well used to fine tune the base-width of the PNP for gain control. Such an additional well would not extend below the isolation region as depicted by the dashed N-well boundary 76 in FIGS. 7, 8 to minimize parasitic capacitance.

Figure 8:
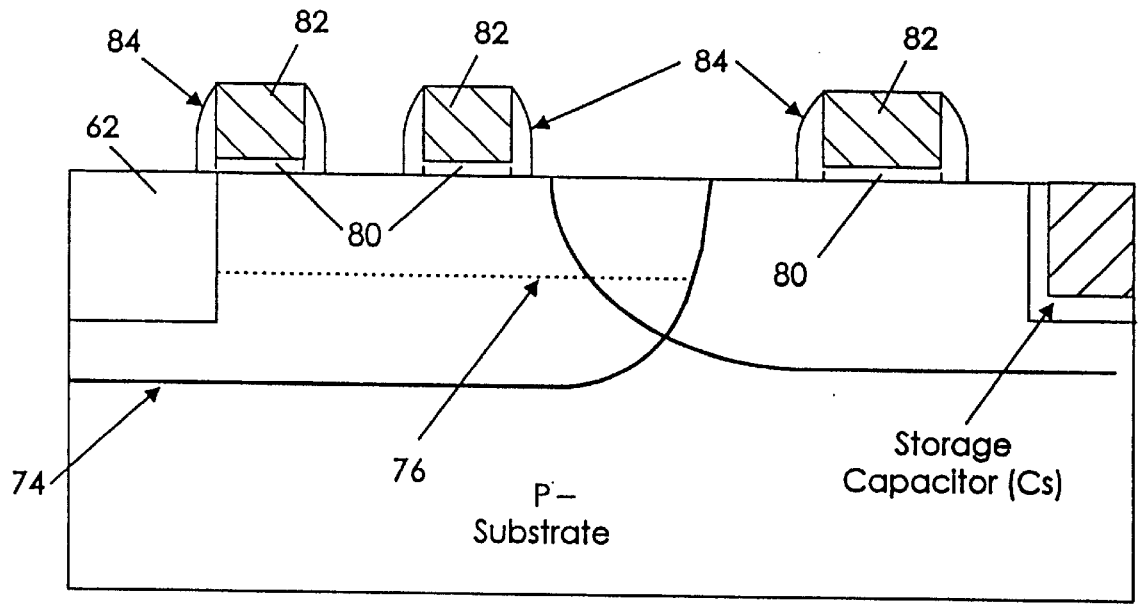
FIG. 8 illustrates a subsequent stage in the fabrication process wherein gate oxide is grown over the well regions, and polysilicon is grown and patterned

Step 3: Grow Gate Oxide Over Well Regions, Deposit Polysilicon and Pattern. (FIG. 8)

This is primarily standard CMOS processing depicted as follows:

(A) Grow gate oxide 80 over silicon exposed areas. This includes the area over the storage capacitor.

(B) Deposit intrinsic polysilicon.

(C) Pattern and etch polysilicon regions 82 to form gates for transistors, and a subsequent implant mask for the emitter region between gates in the N-well.

(D) Form insulating sidewall spacers 84 for junction placement (Step 4) and electrical isolation from shorts, to form the structure shown in FIG. 8.

Step 4: Junction and Gate Electrode Implant. (FIG. 9)

Figure 9:
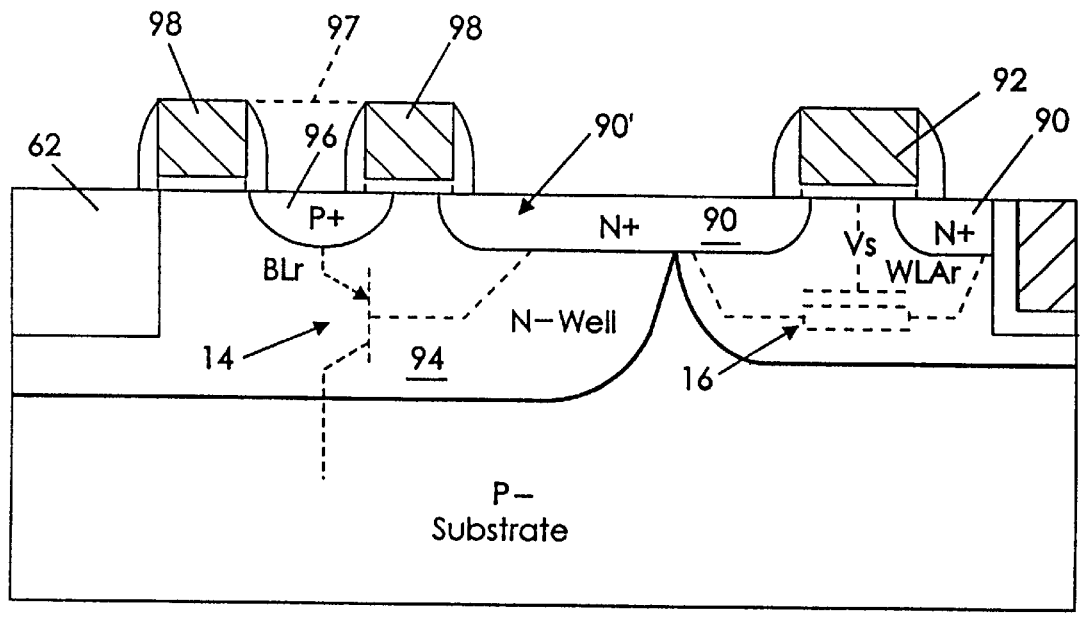
FIG. 9 illustrates a subsequent stage in the fabrication process wherein the source drain junctions and gate electrodes are implanted and activated

The source drain junctions 90 and gate electrodes 92 are implanted and activated in this step as shown in FIG. 9.

Since the bipolar device is in an N-well 94, the electrode doping and the junction doping will be identical to the PMOS transistor type, and additional masks/implant steps are not required. An optional P+ polysilicon stud 97 may be used to fabricate a P+ emitter 96 for high performance. This would be self-aligned to dummy CMOS gates 98. The N-well base contact 90' implant and N+ diffusion implants are merged over the N-well 94 as a butted junction to save space and a wiring interconnect route. The terminals which are present in this view are labeled. The transistor elements are shown as dotted lines. During the N+ implant, the P+ region is masked, and during, the P+ implant, the N+ region is masked. Some of the components of the circuit of FIG. 1 are shown in dashed lines in FIG. 9.

Figure 10:
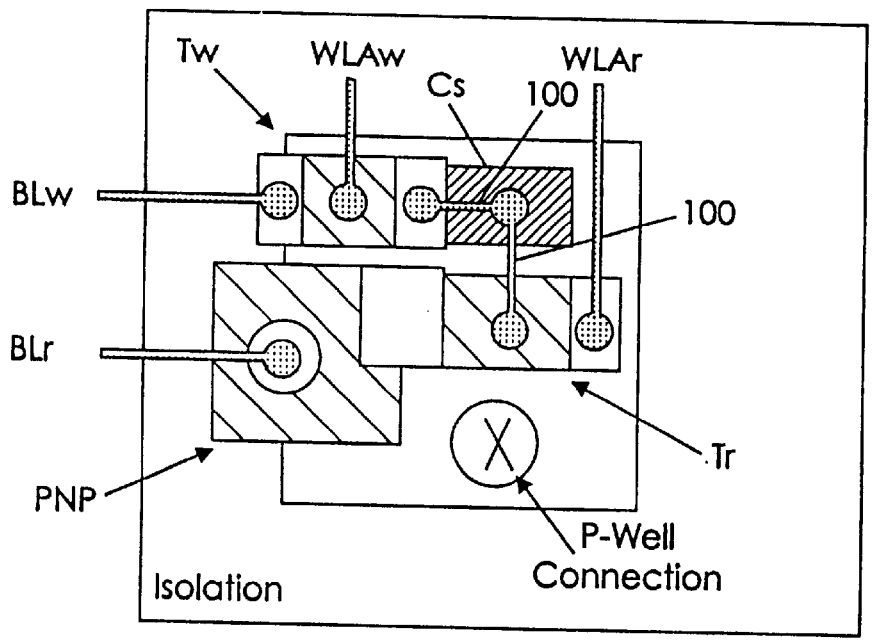
FIG. 10 illustrates a subsequent stage in the fabrication process wherein standard back end of line metal wiring and interconnect levels are used to complete the cell structure.

Step 5: Back End of Line Wiring and Cell Layout. (FIG. 10)

Standard back end of line metal wiring and interconnect levels are used to complete the cell structure. A typical cell layout is shown in FIG. 10. The interconnections 100 between the transistors and the storage capacitor is shown.

It is noted that a complementary process implementation scheme exists for an NPN bipolar transistor using PMOS write and read transistors.

Silicon On Insulator Implementation of the Three Device BICMOS Cell.

It is advantageous to fabricate this cell in Silicon On Insulator (SOI) technology due to improved alpha particle immunity, and reduced cell parasitic capacitance. A discussion of these points, and a completed structure follows.

It is well known that in dynamic memory cell architecture one must protect the data in the cell from a disturb event caused by alpha particle atmospheric radiation. Such an event can cause approximately 5 to 15 fC of charge loss (Qcrit) ["Chip Reliability" 1997 International Reliability Physics Symposium El-Karch, Tonti, Topic 1.] to occur, thus a DRAM cell capacitor must be designed to withstand this. A typical 1 device CMOS cell storage capacitor is on the order of 35 fF, and has sufficient protection for alpha particle (SER) immunity. This capacitor is usually a complex process requiring significant fabrication costs. It's depth is on the order of 7 to 10 $\mu$m. In the three device cell the bipolar gain $\beta$ may be adjusted between 10 and 100. We take full advantage of the bipolar gain and we can thus scale Cs by $\beta$. Step 1 of the bulk CMOS implementation indicates a preferred fabrication sequence for Cs. In SOI we would build a similar structure.

Figure 11:
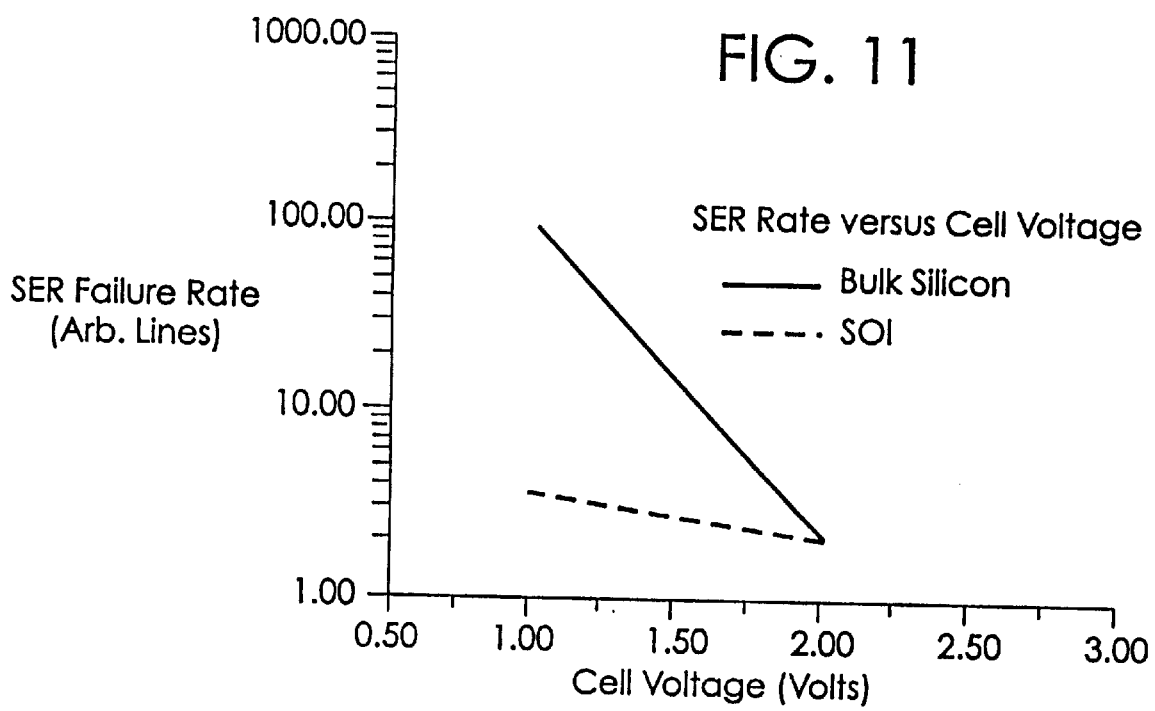
FIG. 11 illustrates a graph wherein SER or alpha particle radiation fails are plotted against Cell Standby Voltage for both bulk silicon and Silicon On Insulator technologies.

Referring to FIG. 11, where SER or alpha particle radiation fails are plotted against Cell Standby Voltage for various technologies we show that the SER susceptibility for low voltage operation is decreased by a factor $\eta$ when the circuit is fabricated in SOI. At low voltage, impact ionization and electron hole pair generation at diffusions is significantly reduced due to the electric field reduction. This, coupled with a smaller diffusion cross section for an alpha particle strike, results in the SER immunity shown in FIG. 11.

The bipolar PNP or NPN may operate at low voltage and retain it's high $\beta$, which makes this cell highly suited for SOI. Cs may be scaled by the factor $\eta\beta$, wherein $\eta$ is generally in the range 10–50.

Figure 12:
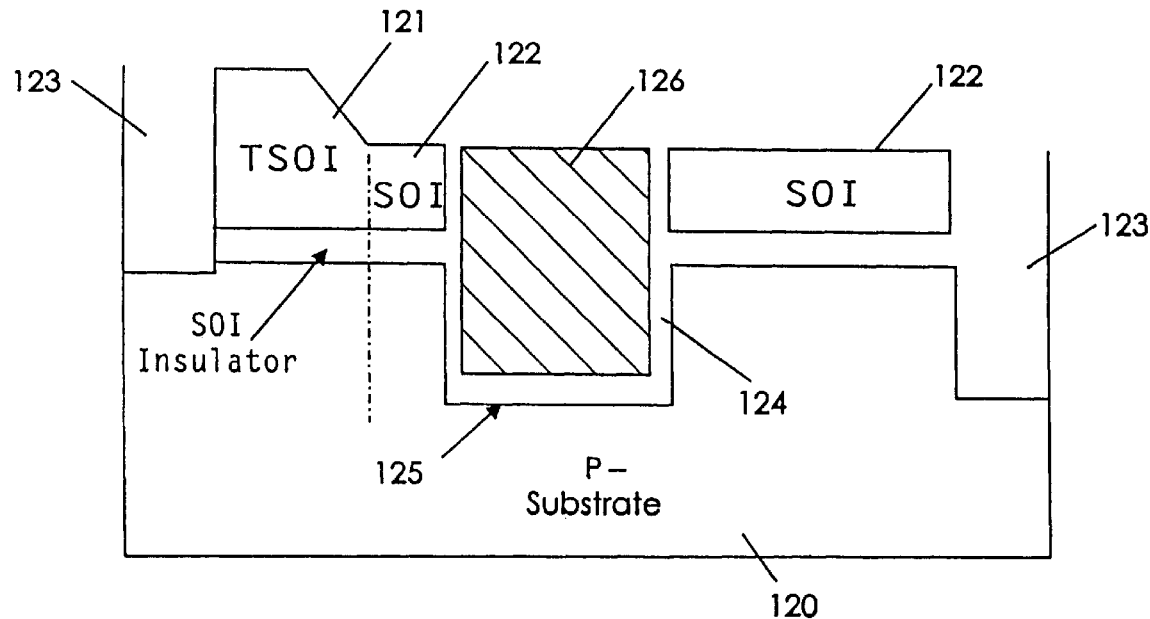
FIG. 12 illustrates an initial stage of a fabrication sequence for the NMOS read/write transistors and the PNP bipolar in Silicon On Insulator technology.

The above allows us to consider very simple and small (area) storage cell capacitors. For example, if we scale the 1-device DRAM storage capacitor Cs conservatively by a factor of 50, then the required trench depth for the 3 device gain cell is on the order of 0.14 $\mu$m. In state of the art technology the isolation trench depth in bulk silicon is approximately 0.35 $\mu$m, thus providing significant alpha particle immunity. In SOI technology the trench would either cut through the top silicon layer, or reside in the silicon layer as shown in FIGS. 6 and 12. The SOI region is modified to accommodate the vertical implants required to complete the bipolar device.

A fabrication sequence for the NMOS read/write transistors and the PNP bipolar follows. The dual process exists for a PMOS read/write transistors and an NPN bipolar.

Step 1: Starting Wafer (FIG. 12)

Starting material is 0.1 $\mu$m P Type SOI 122 on a P type silicon 120 1 $\Omega$-cm ±5% substrate.

A) The CMOS region is masked, and 0.1 $\mu$m epitaxial silicon 121 is grown to accommodate the bipolar device. This region at 121 is called thick SOI, or TSOI, and the original material at 122 is called SOI.

B) Isolation regions 123 (labeled Isolation Oxide) are defined in SOI, and TSOI. Cs regions 125 are defined in SOI. For process simplicity the isolation regions 123 may be etched into the P substrate.

C) A mask is used to etch the silicon trenches 125.

D) A thin dielectric 124 is grown on all trench surfaces, and then polished back or etched to the planar silicon surface. A mask may be used to etch this dielectric from regions where polysilicon 126 is to be deposited (step E), and substrate contact is desired. (note: in FIG. 12 this would be shown as a polysilicon filled trench without the storage dielectric. This contact would be located in an isolated P-Type SOI or TSOI region, with the polysilicon doped P+ diffusing into the underlying substrate during source drain activation.)

E) A mask is used to deposit polysilicon over those regions which will become Cs cell capacitors.

F) The polysilicon is polished or etched back to the silicon surface, and Isolation oxide deposited on the entire wafer to fill the isolation regions. This oxide is then polished or etched back to the silicon surface to form the completed transistor isolation.

Steps 2 through 5 are the same as the bulk silicon implementation, with the bipolar device located in the TSOI region. The CMOS junctions extend through the SOI region and terminate on the SOI insulator. This eliminates the junction area capacitance term, and reduces the junction perimeter term.

Figure 13:
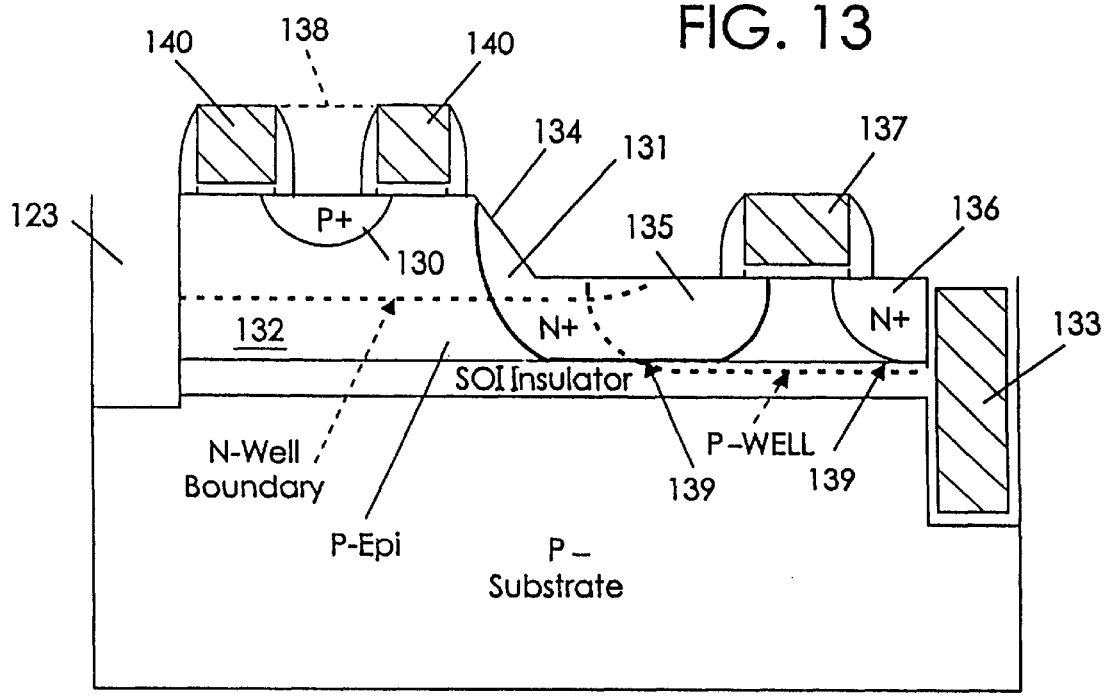
FIG. 13 shows the completed process integration of the key gain cell elements, consisting of the bipolar N-well base, the bipolar collector P-EPI, and the storage capacitor.

FIG. 13 shows the completed process integration of the key gain cell elements, consisting of the bipolar emitter 130, the bipolar N-well base 131, the bipolar collector 132 P-EPI, and the storage capacitor 133. We note the EPI step 134 is used to minimize the horizontal area required to connect the bipolar base. We also show the reduction in the read write transistor parasitic capacitance (as compared to bulk silicon) by junction termination within the SOI insulator region 139.

The Nmos read transistor is described by the elements drain 135, source 136, and gate 137. Note that the read transistor drain is also the bipolar transistor base. Similar to FIG. 9, an optional P+ polysilicon stud 138 may be used to fabricate a P+ emitter 130 for high performance. This would be self-aligned to dummy CMOS gates 140.

While several embodiments and variations of the present invention for a three device BICMOS gain cell are described in detail herein, it should be apparent that the disclosure and teachings of the present invention will suggest many alternative designs to those skilled in the art.

Having thus described our invention, what we claim as new, and desire to secure by Letters Patent is:

1. A gain cell for a dynamic random access memory comprising:
   a. a metal oxide semiconductor field effect write transistor having its gate connected to be driven by a write word line WLw, its drain connected to a storage node Vs having a storage capacitance Cs associated therewith, and its source connected to a write bit line BLw;
   b. a metal oxide semiconductor field effect read transistor having its gate connected to the storage node Vs, and its source connected to a read word line WLr; and
   c. a bipolar transistor having its base connected to the drain of the read transistor, and its emitter connected to a read bit line BLr.

2. A gain cell for a dynamic random access memory as claimed in claim 1, wherein each of the write and read transistors comprises an n channel metal oxide semiconductor field effect transistor, and the bipolar transistor comprises a PNP transistor.

3. A gain cell for a dynamic random access memory as claimed in claim 2, wherein the storage capacitance is connected between the storage node Vs and a substrate of the gain cell.

4. A gain cell for a dynamic random access memory as claimed in claim 2, wherein the collector of the PNP transistor is formed by a substrate of the gain cell.

5. A gain cell for a dynamic random access memory as claimed in claim 2, wherein during a read operation, the previously precharged capacitive read bit line BLr is rapidly discharged through the series connected read transistor and PNP transistor, and rapid discharge of the read bit line BLr is possible because of the high gain of this combination.

6. A gain cell for a dynamic random access memory as claimed in claim 2, wherein the base of the PNP transistor is formed by an N– well which merges into an N+ drain of the read transistor.

7. A gain cell for a dynamic random access memory as claimed in claim 2, wherein the emitter of the PNP transistor is a standard P+ junction, the base is a standard N– well, and the collector is a P– substrate.

8. A gain cell for a dynamic random access memory as claimed in claim 2, wherein the emitter of the PNP transistor is a standard P+ junction.

9. A gain cell for a dynamic random access memory as claimed in claim 8, wherein the base is a standard N– well, and the collector is the P– substrate.

10. A gain cell for a dynamic random access memory as claimed in claim 8, wherein the base is a modified N– well used to separately tune the bipolar transistor gain, and the collector is the P– substrate.

11. A gain cell for a dynamic random access memory as claimed in claim 2, wherein the emitter of the PNP transistor is diffused from a P+ polysilicon stud.

12. A gain cell for a dynamic random access memory as claimed in claim 11, wherein the base is a modified N– well used to separately tune the bipolar transistor gain, and the collector is the P– substrate.

13. A gain cell for a dynamic random access memory as claimed in claim 1, wherein each of the write and read transistors comprises a p channel metal oxide semiconductor field effect transistor, and the bipolar transistor comprises an NPN transistor.

14. A gain cell for a dynamic random access memory as claimed in claim 13, wherein the storage capacitance is connected between the storage node Vs and a substrate of the gain cell.

15. A gain cell for a dynamic random access memory as claimed in claim 13, wherein the collector of the NPN transistor is formed by a substrate of the gain cell.

16. A gain cell for a dynamic random access memory as claimed in claim 13, wherein during a read operation, the previously uncharged capacitive read bit line BLr is rapidly charged through the series connected read transistor and NPN transistor, and rapid charge of the read bit line BLr is possible because of the high gain of this combination.

\* \* \* \* \*